(12) United States Patent
Suzuki et al.

(10) Patent No.: US 7,771,561 B2
(45) Date of Patent: Aug. 10, 2010

(54) APPARATUS AND METHOD FOR SURFACE TREATMENT TO SUBSTRATE

(75) Inventors: Naoki Suzuki, Neyagawa (JP); Kazuto Nishida, Katano (JP); Kazuyuki Tomita, Ikoma (JP)

(73) Assignee: Panasonic Corporation, Osaka (JP)

( * ) Notice: Subject to any disclaimer, the term of this patent is extended or adjusted under 35 U.S.C. 154(b) by 400 days.

(21) Appl. No.: 11/598,067

(22) Filed: Nov. 13, 2006

(65) Prior Publication Data
US 2007/0062558 A1    Mar. 22, 2007

Related U.S. Application Data

(62) Division of application No. 10/233,440, filed on Sep. 4, 2002, now abandoned.

(30) Foreign Application Priority Data

Sep. 5, 2001    (JP) .............................. 2001-268801

(51) Int. Cl.
*H01L 21/00*    (2006.01)
*C23C 16/00*    (2006.01)
*C23C 14/00*    (2006.01)

(52) U.S. Cl. ..................... 156/345.24; 156/345.26; 156/345.28

(58) Field of Classification Search ............ 156/345.24, 156/345.25, 345.28
See application file for complete search history.

(56) References Cited

U.S. PATENT DOCUMENTS

| 5,302,238 | A | * | 4/1994 | Roe et al. ..................... 216/11 |
| 5,415,718 | A | | 5/1995 | Ohmi et al. |
| 5,552,016 | A | | 9/1996 | Ghanayem |
| 5,607,602 | A | | 3/1997 | Su et al. |
| 5,685,942 | A | | 11/1997 | Ishii |
| 5,879,574 | A | | 3/1999 | Sivaramakrishnan et al. |
| 5,971,591 | A | | 10/1999 | Vona et al. |

(Continued)

FOREIGN PATENT DOCUMENTS

JP    1-189924    7/1989

(Continued)

OTHER PUBLICATIONS

K. Shimamoto et al., entitled "*A Patent Handbook of Practical Semiconductor Technology*", issued Jul. 1986, Science Forum, pp. 93-95 (with partial translation).

*Primary Examiner*—Ram N. Kackar
(74) *Attorney, Agent, or Firm*—Wenderoth, Lind & Ponack, L.L.P.

(57) ABSTRACT

An apparatus and a method for surface treatment of substrates whereby the quality of substrates can be maintained by preventing excessive plasma treatment of substrates. In carrying out the plasma treatment on a surface of the substrate in a reaction chamber, there are provided an emission spectroscopic analysis device or a mass analyzer, and a controller, so that the energy of ions in plasma is controlled to decrease when, e.g., bromine included in the substrate is detected, and the surface treatment to the substrate is controlled to stop when the removal of impurities of the substrate is detected to end. The bromine once separated from the substrate is prevented from adhering again to the substrate and corroding the substrate. Moreover, ions are prevented from being excessively irradiated to the substrate when the removal of impurities ends, thereby reducing damage to the substrate.

10 Claims, 4 Drawing Sheets

U.S. PATENT DOCUMENTS

| | | | |
|---|---|---|---|
| 6,143,125 | A | 11/2000 | Shoji |
| 6,197,116 | B1 | 3/2001 | Kosugi |
| 6,455,437 | B1 | 9/2002 | Davidow et al. |
| 2001/0019897 | A1 | 9/2001 | Kumar et al. |
| 2003/0052083 | A1 | 3/2003 | Kim et al. |

FOREIGN PATENT DOCUMENTS

| | | |
|---|---|---|
| JP | 1-298181 | 12/1989 |
| JP | 8-222544 | 8/1996 |
| JP | 10-98022 | 4/1998 |

\* cited by examiner

US 7,771,561 B2

APPARATUS AND METHOD FOR SURFACE TREATMENT TO SUBSTRATE

This is a divisional application of Ser. No. 10/233,440 filed Sep. 4, 2002 now abandoned.

BACKGROUND OF THE INVENTION

The present invention relates to an apparatus for executing surface treatment such as cleaning, modifying or the like on substrate surfaces by plasma, and a method for substrate surface treatment carried out by the substrate surface treatment apparatus.

High-packaging density has been required in the field of a mounting technique in accordance with miniaturization and multifunction of electronic devices. Consequently, connections between elements and substrates should be carried out on a remarkably fine scale, and mounting with a higher degree of reliability is being required. There currently is a method of modifying substrate surfaces by plasma, i.e., plasma treatment as one example for securing the reliability. For instance, the plasma treatment can remove an organic contaminant adhering to the substrate surface, and the bonding strength between a gold electrode and a wire in the case of wire bonding can be improved when an inorganic substance such as nickel hydroxide or the like deposited on an electrode face as a bonding face formed of copper, nickel, and gold on a printed board is removed by the sputtering action of argon plasma. Also in the case where an IC is to be bonded to a lead electrode on a polyimide film substrate via an ACF (anisotropic conductive film), the bonding strength between the polyimide film and the ACF can be improved through activation of a surface of the polyimide film substrate by irradiating oxygen plasma to the film before bonding. Moreover, the plasma treatment carried out on the substrate improves the fluidity of a sealing resin on the substrate and the adhesion between the substrate and the sealing resin.

An example of the plasma treatment method referred to above will be described below with reference to the drawing FIGS. 3-5.

FIG. 3 roughly shows the configuration of a conventional apparatus 20 for surface treatment of mounting substrates, in which a reaction chamber 1 being grounded is provided with a gas introduction port 2 and a vacuum exhaust port 3. A RF electrode 5 is arranged in the reaction chamber 1 via an insulating ring 4 to a side wall of the reaction chamber 1. The RF electrode 5 has a constitution on which a mounting substrate 6 can be placed. An opposed electrode 7 is arranged in the reaction chamber 1 so as to face the RF electrode 5 and is grounded. A RF(Radio-Frequency) is applied to the RF electrode 5 by a RF supply source 8 through a matching tuner (not shown) and a RF power supply part. O-rings (not shown) are interposed between the RF electrode 5 and the insulating ring 4 and between the insulating ring 4 and the side wall of the reaction chamber 1. For preventing the O-rings from being heated to 200° C. or higher and maintaining the reaction chamber 1 in vacuum, a cooling groove 9 where a cooling water flows is formed in the side wall of the reaction chamber 1.

The surface treatment method to mounting substrates carried out by the above-constituted surface treatment apparatus 20 will be described hereinbelow in an example in which an argon gas is used for substrates before wire bonding.

The substrate 6, before being subjected to wire bonding, is placed on the RF electrode 5. While a degree of vacuum in the reaction chamber 1 is kept to be 30 Pa with 50SCCM (standard cc/min) of the argon gas being supplied from the gas introduction port 2, a RF(Radio-Frequency) of 200 W is applied to the RF electrode 5, thereby generating plasma. Argon ions in the plasma are irradiated onto a face of the substrate 6 exposed in the plasma. The substrate 6 is formed of glass cloth epoxy resin. An electrode 10 formed on the surface of the substrate 6 is constituted of three layers of a copper layer 11 having a film thickness of 35 µm, a nickel layer 12 having a film thickness of 3 µm and a gold layer 13 having a film thickness of 0.05 µm as shown in FIG. 4. The undercoat nickel 12 is moved onto a surface of the gold 13 through a heat process or the like, whereby nickel hydroxide or the like is deposited. The nickel hydroxide is sputtered and removed by the irradiation of argon ions. The surface of the gold 13 is cleaned accordingly.

FIG. 5 is a schematic diagram of a case in which a silicon chip IC 16 is bonded via an ACF (anisotropic conductive film) 15 to a polyimide film substrate 14. As shown in FIG. 5, electrodes 18 of the IC 16 are bonded via the ACF 15 composed of a resin containing conductive particles to electrode parts 17 on the polyimide film substrate 14. A surface treatment method for the polyimide film substrate 14 having the above constitution will be described below.

The polyimide film substrate 14 is placed on the RF electrode 5. A RF(Radio-Frequency) of 200 W is applied to the RF electrode 5 while a degree of vacuum in the vacuum chamber 1 is maintained at 30 Pa with 50SCCM of an oxygen gas supplied from the gas introduction port 2. As a result, plasma is generated. Oxygen radicals or oxygen ions present in the plasma are irradiated onto a surface of the polyimide film substrate 14 exposed in the plasma. The oxygen radicals react with contamination organic substances adhering on the polyimide film substrate 14, whereby the contamination organic substances are decomposed to be sublimation compounds such as $CO_2$ or the like and then removed. Further, functional groups such as $C=O$, COOH and the like are generated on the surface of the polyimide film substrate 14, activating the surface of the polyimide film substrate. The bonding strength between the polyimide film substrate 14 and the ACF 15 is improved accordingly.

In the case of polyimide film substrate 14, residual ions of chlorine or the like are left yet on the polyimide film substrate 14 when the apparatus receives the polyimide film substrate 14. The reason for this is that hydrochloric acid is used as one of components of a plating solution for forming a pattern of the electrodes 17 on the polyimide film substrate 14 by plating, and, for example, chlorine ions are left if the substrate is not fully cleaned by water after the pattern is formed. In the event that the IC 16 is connected with the use of the ACF 15 to the polyimide film substrate 14 having the residual ions, the residual ions cause corrosion and electrical failures such as ion migration, etc. As such, the plasma treatment is carried out to remove the chlorine ions.

However, if the plasma treatment is carried out on the substrate 6 before being subjected to wire bonding, not only the organic contaminant, inorganic substance, or the like, but the substrate 6 is sputtered by argon ions simultaneously. In the case of the substrate 6 formed of glass cloth epoxy resin, Br (bromine) included in the substrate 6 adheres again to the substrate after being separated from the substrate 6 by the plasma treatment. In the case of the Br adhering to the electrode 10, the trouble is that the Br adhering on the electrode 10 reacts with moisture in the air and becomes HOBr or HBr when the substrate 6 is exposed to the atmosphere, which causes corrosion of the electrode 10.

When the plasma treatment is carried out with the aim of removing residual ions adhering to the polyimide film substrate 14, since there is no means for observing whether or not the residual ions are actually removed, the plasma treatment may be executed to an excessive stage in order to perfectly remove the residual ions. Thus the trouble is that the excessive plasma treatment may also damage the polyimide film substrate 14.

SUMMARY OF THE INVENTION

Accordingly, the present invention is devised to solve the above-discussed problems inherent in the conventional art and an object of the present invention is to provide an apparatus and a method for surface treatment to substrates whereby the substrate quality can be maintained by preventing an excessive plasma treatment to the substrates.

In accomplishing the above objective, according to a first aspect of the present invention, there is provided a substrate surface treatment apparatus for executing surface treatment of a substrate arranged in a reaction chamber by ions in plasma generated in the reaction chamber, which comprises:

a detecting device arranged adjacent to the reaction chamber for detecting at least whether or not components constituting the substrate are separated from the substrate, or whether or not impurities adhering to a surface of the substrate are removed by the surface treatment; and a controller connected to the detecting device for reducing an energy of the ions in the plasma on the basis of the detected information by the detecting device when the separation of components is brought about, and for terminating the surface treatment on the basis of the detected information by the detecting device when the removal of impurities ends.

The substrate surface treatment apparatus may be further provided with a plasma generating device including electrodes arranged in the reaction chamber for generating the plasma and a power supply unit for supplying electricity to the electrodes, and a vacuum degree adjusting device connected to the reaction chamber for adjusting a degree of vacuum in the reaction chamber.

The controller controls operations of the power supply unit and the vacuum degree adjusting device on the basis of the detected information by the detecting device so as to control reduction of the energy of the ions and to end the surface treatment.

The above detecting device may be comprised of a spectroscopic analyzer for conducting spectral observation of light generated by the plasma and detecting the components and the impurities of the substrate on the basis of the observation.

The above detecting device may be comprised of a mass analyzer for analyzing gas elements in the reaction chamber and detecting the components and the impurities of the substrate on the basis of the gas analysis.

The components of the substrate to be detected by the detecting device may be bromine (Br).

The impurities to be detected by the detecting device may be chlorine.

According to a second aspect of the present invention, there is provided a substrate surface treatment method for executing surface treatment of a substrate arranged in a reaction chamber by ions in plasma generated in the reaction chamber, which comprises:

detecting at least either whether or not components constituting the substrate are separated from the substrate by the surface treatment, or whether or not impurities adhering to a surface of the substrate are removed by the surface treatment; and controlling on a basis of the detected information an energy of the ions in the plasma to reduce when the separation of components is detected to take place and the surface treatment to end when the removal of impurities is detected to end.

By the above construction of the aspects of the present invention, there are provided the detecting device and the controller, so that the energy of ions in the plasma is controlled to decrease when the constituent separated from the substrate is detected, and the surface treatment to the substrate is controlled to terminate when the completion of removing impurities adhering to the substrate is detected. In the arrangement as above, the constituent of the substrate can be prevented from separating and scattering from the substrate. Therefore the phenomenon that the separated constituent from the substrate adheres again to the substrate and the redeposit of the separated constituent causes corrosion to the substrate is avoided. Furthermore, the ions are prevented from excessively irradiating the substrate when the removal of impurities is completed, therefore reducing damage to the substrate.

The first embodiment and the second embodiment of the present invention enable the prevention of excessive plasma treatment of substrates while maintaining the quality of the substrates.

When the plasma generating device and the vacuum degree adjusting device are provided additionally, the controller can control the power supply unit installed at the plasma generating device and the vacuum degree adjusting device on the basis of detected information by the detecting device. In other words, the power to be supplied to the electrode in the plasma generating device is reduced by controlling the power supply unit, so that the energy of ions in the plasma can be decreased. As a result, the efficiency for sputtering can be lowered. Moreover, a collision probability between gas molecules and ions in the reaction chamber increases by raising the pressure in the reaction chamber by the vacuum degree adjusting device, and eventually the energy of the ions can be decreased. Furthermore, the plasma treatment can be stopped by, e.g., stopping the power supply.

When the spectroscopic analyzer is used as the detecting device, the detecting device can be arranged on the outside of the reaction chamber, and the whole construction of the substrate surface treatment apparatus is simplified.

When the mass analyzer is used as the detecting device, the constituent and impurities of the substrate can be detected with a higher degree of accuracy than by the spectroscopic analyzer, thus enabling the quality of the substrate to be maintained at a high level.

BRIEF DESCRIPTION OF THE DRAWINGS

These and other objects and features of the present invention will become clear from the following description taken in conjunction with the preferred embodiments thereof with reference to the accompanying drawings in which.

DETAILED DESCRIPTION OF THE PREFERRED EMBODIMENTS

Figure 1:
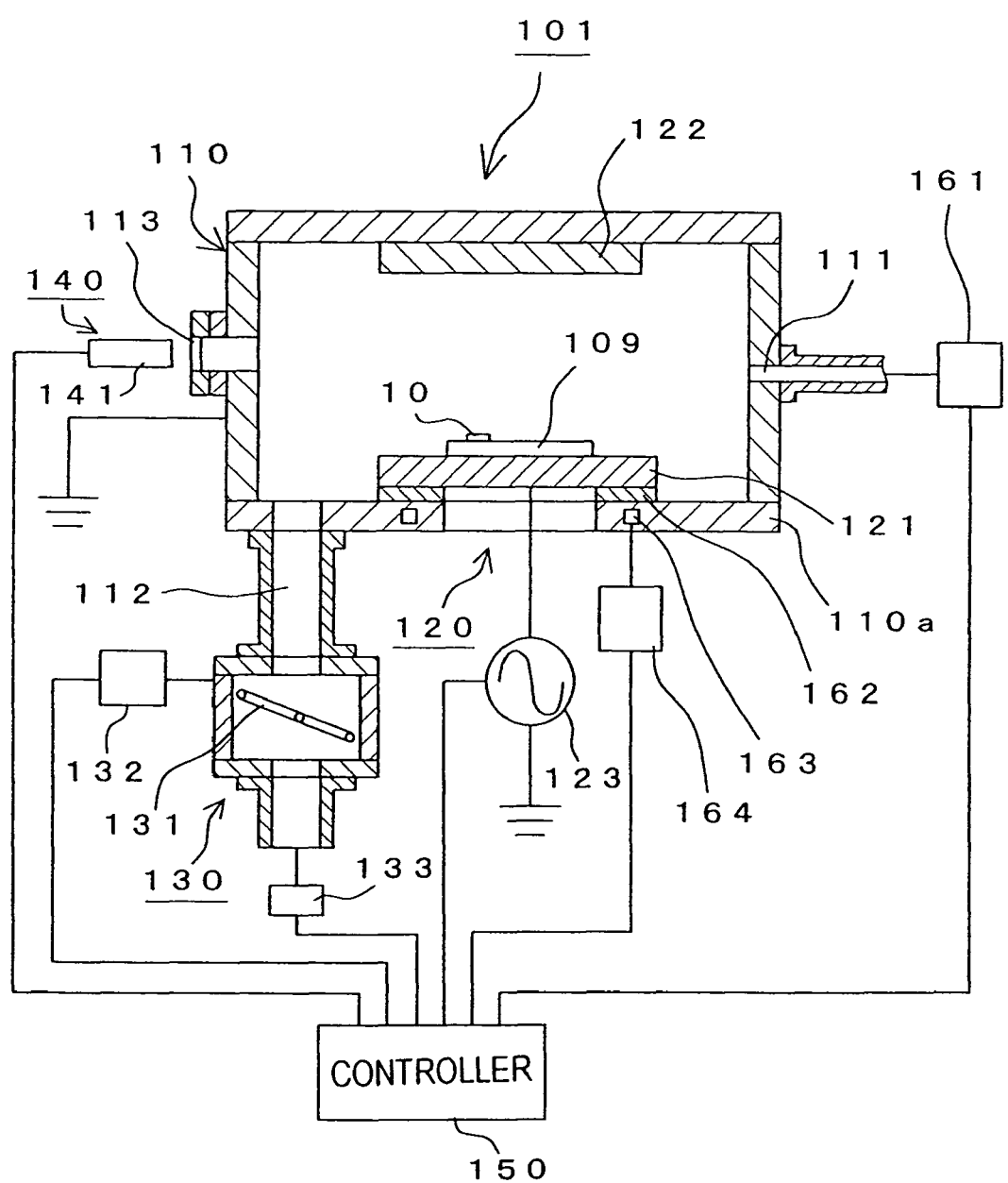
FIG. 1 is a schematic diagram of the configuration of a surface treatment apparatus for substrates according to a first embodiment of the present invention.

An apparatus for surface treatment of substrates and a method for surface treatment of substrates which is carried out by the apparatus according to the preferred embodiments of the present invention will be described below with reference to the attached drawings. It is to be is noted that like parts are designated by like reference numerals throughout the accompanying drawings.

First Embodiment

FIG. 1 is a schematic diagram showing the construction of a substrate surface treatment apparatus 101 according to a first embodiment. Roughly speaking, the apparatus 101 has a reaction chamber 110, a plasma generating device 120, a vacuum degree adjusting device 130, a detecting device 140, and a controller 150. The reaction chamber 110 in which a substrate 109 is stored is a vessel for carrying out surface treatment by plasma to the substrate 109, which comprises a reaction gas introduction port 111, an exhaust port 112 and an observation window 113, and is grounded. To the reaction gas introduction port 111 is connected a reaction gas supply unit 161 which supplies a reaction gas for generating desired ions into the reaction chamber 110 via the reaction gas introduction port 111. The operation of the reaction gas supply unit 161 is controlled by the controller 150.

Inside the reaction chamber 110, there is arranged an electrode 121 connected via an insulating ring 162 to a side wall 110a of the reaction chamber 110. The electrode 121 is constituted so that the substrate 109 can be placed on the electrode 121. O-rings are interposed between the electrode 121 and the insulating ring 162 and between the insulating ring 162 and the side wall 110a, whereby the reaction chamber 110 is kept in vacuum. Moreover, a cooling groove 163 for passing a coolant, e.g., cooling water, is formed in the side wall 110a so as to prevent the O-rings from being heated to 200° C. or more. A coolant supply unit 164 which is controlled in operation by the controller 150 for supplying the coolant, i.e., cooling water in this embodiment is connected to the cooling groove 163.

Also in the reaction chamber 110, an opposed electrode 122, which is grounded, is arranged opposite to the electrode 121. A RF(Radio-Frequency) is applied to the electrode 121 by a power supply unit 123 including a matching tuner and a RF power supply part. The plasma generating device 120 is constituted of the electrode 121, the opposed electrode 122 and the power supply unit 123. The operation of the power supply unit 123 is controlled by the controller 150. Plasma can be generated between the electrode 121 and the opposed electrode 122 by supplying the RF to the electrode 121 in the reaction chamber 110 to which a predetermined reaction gas is supplied in a vacuum state.

According to the embodiment, an emission spectroscopic analysis device 141 is arranged as an example of a spectroscopic analyzer and the detecting device 140 for observing a state of the plasma in the reaction chamber 110 from the outside of the apparatus, and more specifically, for observing an emission state of the plasma from the outside of the apparatus. The emission spectroscopic analysis device 141 is disposed adjacent to the observation window 113. Although described in detail later, the detecting device 140 detects at least either whether or not components constituting the substrate 109 are separated from the substrate 109 by the surface treatment carried out on the substrate 109 with the utilization of the plasma, or whether or not impurities adhering to a surface of the substrate 109 are removed by the surface treatment.

The vacuum degree adjusting device 130 connected to the reaction chamber 110 is a device for adjusting the degree of vacuum in the reaction chamber 110. The vacuum degree adjusting device 130 has a valve 131 for shutting the inside from the outside of the reaction chamber 110, more precisely, for shutting the inside from a vacuum pump 133 to be described below, a valve switch 132 for controlling an opening degree of the valve 131, and the vacuum pump 133 for turning the interior of the reaction chamber 110 to vacuum via the valve 131. As will be detailed later, the vacuum degree adjusting device 130 adjusts the degree of vacuum inside the reaction chamber 110 in accordance with a control signal sent from the controller 150 on the basis of detected information sent from the detecting device 140, namely, the emission spectroscopic analysis device 141 in the embodiment to the controller 150. Specifically, the control signal is supplied to the valve switch 132, whereby the valve 131 is opened at the opening degree conforming to the control signal. The degree of vacuum in the reaction chamber 110 is adjusted in this manner.

Operation, i.e., the surface treatment method in the above-constituted substrate surface treatment apparatus 101 will be described below. The controller 150 carries out control related to the substrate surface treatment method. The following description is based on a state in which the substrate 109 is already placed on the electrode 121.

Figure 4:
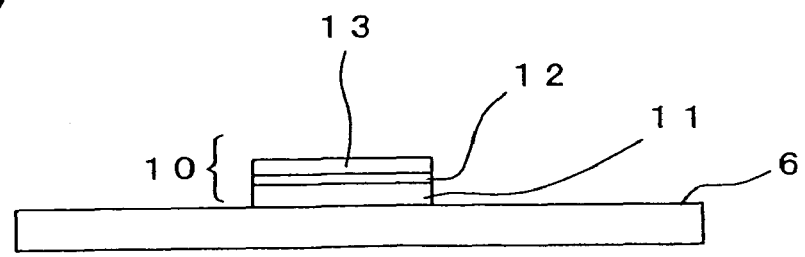
FIG. 4 is a diagram showing the constitution of a substrate electrode.
Figure 5:
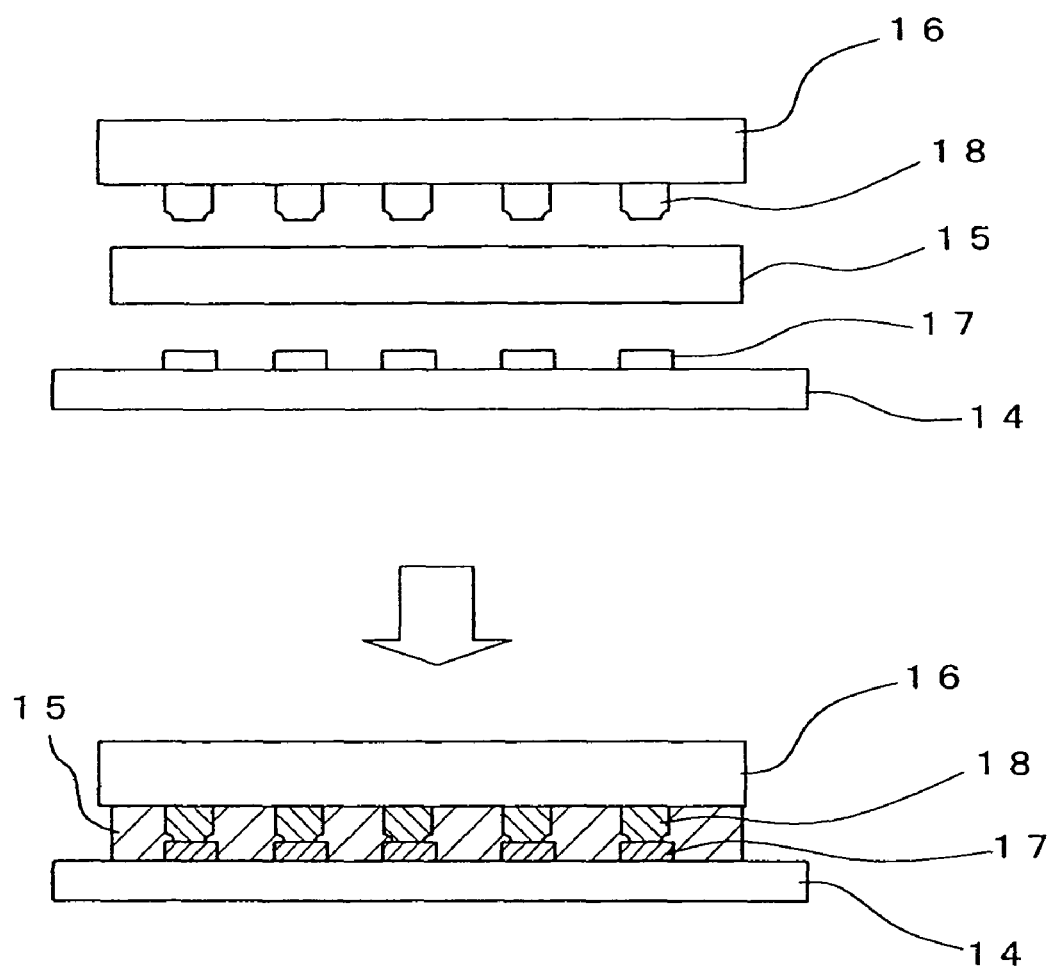
FIG. 5 is a diagram for briefly explaining bonding when an IC chip is bonded via an ACF to a film substrate.

While the air in the reaction chamber 110 is discharged by the vacuum pump 133, 50SCCM of an argon gas is supplied from the reaction gas introduction port 111 by the reaction gas supply unit 161 so that the reaction chamber 110 is held in a degree of vacuum of 30 Pa. In this state, 200 W RF(Radio-Frequency) is applied to the electrode 121 from the power supply unit 123 to generate plasma between the electrode 121 and the opposed electrode 122 in the reaction chamber 110. Argon ions present in the plasma are irradiated to the surface of the substrate 109 exposed in the plasma. Although nickel hydroxide or the like is deposited onto a surface of the electrode 10, which is formed of gold on the substrate 109 in the same arrangement as that described with reference to FIG. 4, through a heat process or the like as discussed in the "BACKGROUND OF THE INVENTION", the nickel hydroxide or the like is removed by the sputtering action because of the irradiation of argon ions, and therefore, the surface of the electrode 10 formed of gold is cleaned.

At this time, the surface of the substrate 109 except the electrode 10 is also sputtered by the irradiation of argon ions. In the case where the substrate 109 is formed of glass cloth epoxy resin, Br (bromine) as one of components constituting the substrate 109 is sputtered as well, emitted into the reaction chamber 110. Thus, there is the apprehension that the emitted Br will again adhere to the surface of the substrate 109.

Meanwhile, according to the present embodiment, the plasma state in the reaction chamber 110 is monitored at all times through the observation window 113 by the emission spectroscopic analysis device 141. The emission spectroscopic analysis device 141 sends a signal to the controller 150 at a time point when an emission spectrum of the Br is observed. The controller 150 in return controls and adjusts the power supply unit 123 and the valve switch 132 to reduce the energy of argon ions in the plasma to prevent the Br from being sputtered. More specifically, the controller 150 decreases the electric power to be supplied from the power supply unit 123 to the electrode 121 and also drives the valve 131 in a direction to close the valve to raise the pressure in the reaction chamber 110. Since the energy of argon ions is reduced by decreasing the electric power, the efficiency for sputtering can be deteriorated. At the same time, a collision probability between gas molecules and the argon ions in the reaction chamber 110 is increased by raising the pressure, and eventually the energy of argon ions is reduced. Thus, the sputtering efficiency can be decreased. Accordingly, only the nickel hydroxide deposited on the electrode 10 of the substrate 109 can be removed by the sputtering action through the irradiation of argon ions, while the Br contained in the substrate 109 is prevented from being sputtered.

The sputtering efficiency to the nickel hydroxide is deteriorated by the reduction in the energy of argon ions as above. But, where the nickel hydroxide is deposited is the surface of the electrode 10 as mentioned above, and therefore the nickel hydroxide is sputtered with priority by the irradiation of argon ions. In contrast, since the Br is included in the substrate 109, the amount of Br to be sputtered is relatively small. That is, the sequence of the above operations is based on the idea that the nickel hydroxide has been removed as much as possible before the Br is emitted from the substrate 109.

Since the nickel hydroxide can be removed from the surface of the gold electrode 10 of the substrate 109, the bonding strength between the gold electrode 10 and a wire can be improved when the gold electrode 10 is to be wire bonded.

According to the embodiment as described hereinabove, in processing the substrate 109 formed of glass cloth epoxy resin by argon plasma, the plasma state in the reaction chamber 110 is always monitored through the observation window 113 by the emission spectroscopic analysis device 141, and the controller 150 controls the power supply unit 123 and the valve switch 132 to adjust so as not to sputter the Br when the emission spectrum of the Br is observed. Therefore, only the nickel hydroxide deposited on the gold electrode 10 of the substrate 109 can be removed by irradiating argon ions while the Br as a constituent of the substrate 109 is prevented from scattering. In consequence of this, the phenomenon that the sputtered Br adheres again to the substrate 6 does not arise, and the conventional trouble that the Br and the moisture in the air react with each other when the substrate 6 having the Br adhering to the electrode 10 is exposed to the atmosphere, thereby forming HOBr or HBr, does not arise. Therefore, the corrosion of the electrode 10 of the substrate 109 can be prevented.

In the present embodiment, the controller 150 controls both of the power supply unit 123 and the valve switch 132 when the emission spectrum of the Br is observed. However, the aforementioned effect is obtained by controlling at least one of the power supply unit 123 and the valve switch 132 as is apparent from the foregoing description.

The substrate 109 is formed of glass cloth epoxy resin in the above description. Hereinbelow will be discussed the substrate 109 formed of a polyimide film.

As is described in the "BACKGROUND OF THE INVENTION", in the case of the substrate 109 formed of a polyimide film, chlorine ions are sometimes left as an example of impurities on the surface of the substrate 109 if cleaning at a manufacturing time of the substrate is insufficient. For removing the chlorine ions, an oxygen gas is supplied by 50SCCM into the reaction chamber 110 through the reaction gas introduction port 111 by the reaction gas supply unit 161. While the degree of vacuum in the reaction chamber 110 is maintained at 30 Pa, 200 W RF(Radio-Frequency) is applied to the electrode 121, thereby generating plasma. Oxygen ions present in the plasma are irradiated onto the surface of the substrate 109 exposed in the plasma, which sputter and remove residual chlorine ions on the surface of the substrate 109.

In the meantime, the plasma state in the reaction chamber 110 is monitored at all times by the emission spectroscopic analysis device 141 through the observation window 113. The emission spectroscopic analysis device 141 observes an emission spectrum of chlorine. At a time point when the removal of impurities terminates, that is, the emission spectrum of chlorine disappears or the emission spectrum of chlorine decreases to a level where no trouble is substantially brought about, the emission spectroscopic analysis device 141 sends a signal to the controller 150, and the controller 150 controls the power supply unit 123, the valve switch 132 and the reaction gas supply unit 161 to stop the plasma treatment.

Since the chlorine ions remaining at the substrate 109 formed of the polyimide film can be removed in the manner as above, the problems of corrosion due to residual ions, electrical failures such as ion migration or the like, which are caused by connecting the IC with the use of ACF in a state in which chlorine ions remain, can be prevented.

In addition, by observing the emission spectrum of chlorine by the emission spectroscopic analysis device 141, the plasma treatment of the substrate 109 is stopped when chlorine as an impurity is removed. Therefore, chlorine ions remaining at the substrate 109 can be removed while the effect of oxygen ions to the substrate 109 is restricted to a minimum. At the same time, since the substrate 109 is formed of polyimide, an organic contaminant at the polyimide surface can be removed by the oxygen radicals and oxygen ions as described in the "BACKGROUND OF THE INVENTION", and also functional groups such as C=O, COOH, etc. are formed on the surface, thereby activating the surface of the substrate 109. The bonding strength between the substrate and the ACF is improved accordingly.

Second Embodiment

The above substrate surface treatment apparatus 101 is exemplified in the arrangement of using the emission spectroscopic analysis device 141 as the detecting device 140 as shown in FIG. 1. The detecting device 140 is not limited to the emission spectroscopic analysis device, and a mass analyzer 142 may be employed as will be described below with reference to FIG. 2.

Figure 2:
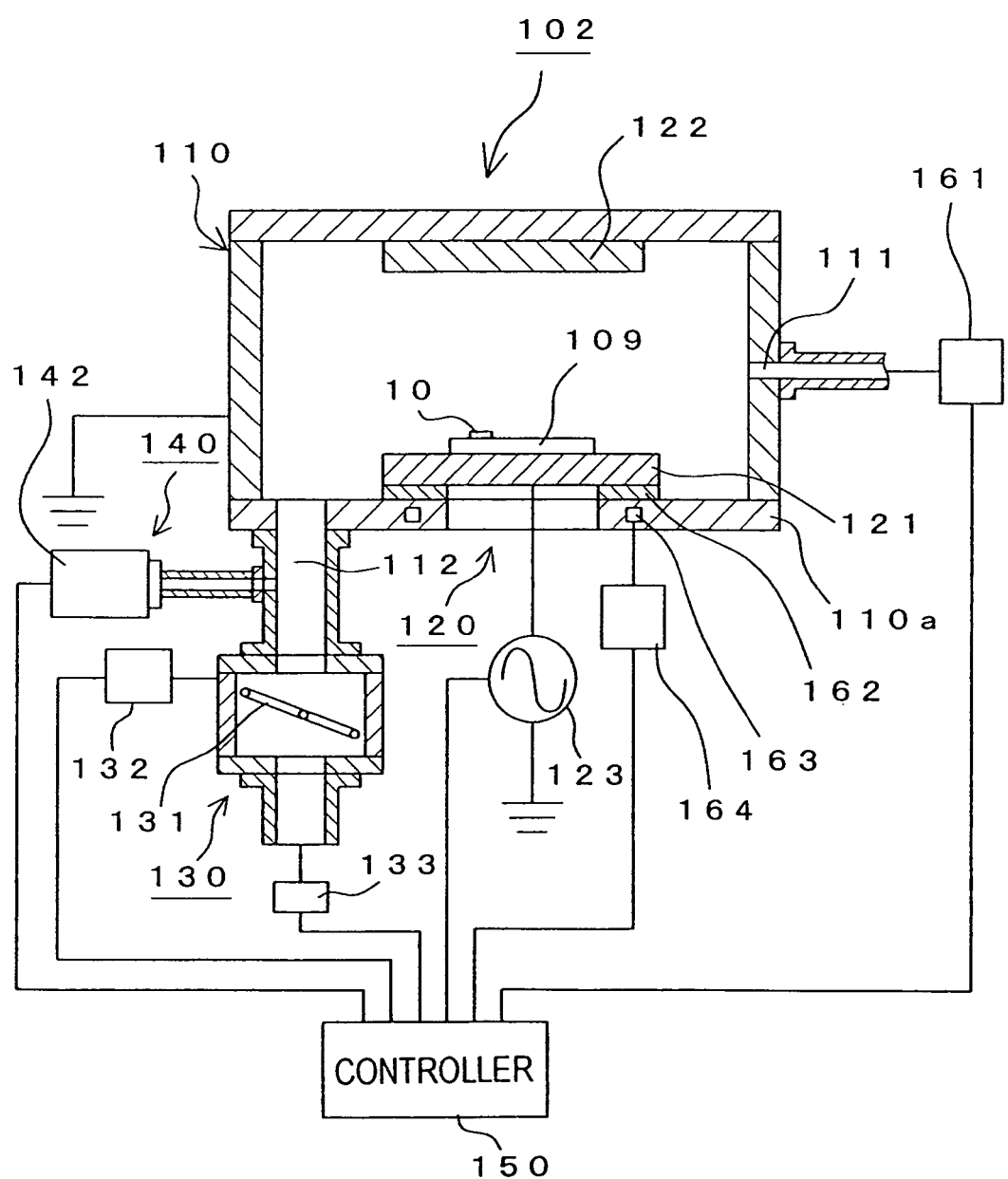
FIG. 2 is a schematic diagram of the configuration of a surface treatment apparatus for substrates according to a second embodiment of the present invention.
Figure 3:
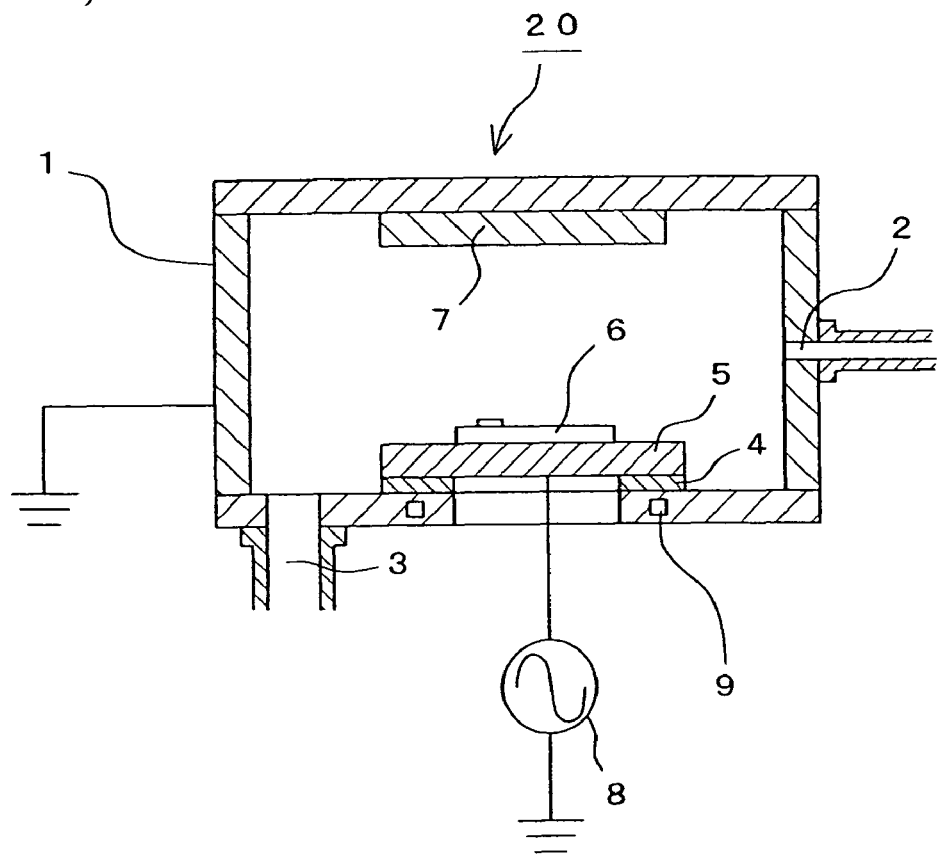
FIG. 3 is a schematic diagram of the configuration of a conventional surface treatment apparatus for substrates.

A substrate surface treatment apparatus 102 indicated in FIG. 2 is constituted including the mass analyzer 142 in place of the emission spectroscopic analysis device 141 installed in the foregoing substrate surface treatment apparatus 101. The same parts in the substrate surface treatment apparatus 102 as those of the substrate surface treatment apparatus 101 are designated by the same reference numerals, and thus are omitted from the description. Only different parts will be discussed below.

Since the emission spectroscopic analysis device 141 is eliminated from the substrate surface treatment apparatus 102, no observation window 113 is formed in the reaction chamber 110. On the other hand, the mass analyzer 142 is mounted on the exhaust port 112 communicating with the valve 131 from the reaction chamber 110 so as to analyze a plurality of gas elements present at the exhaust port 112, that is, in the reaction chamber 110. The mass analyzer 142 is connected to the controller 150.

The operation, i.e., surface treatment method in the substrate surface treatment apparatus 102 constructed as above, will be described hereinbelow. Comparing the substrate surface treatment method in the apparatus 102 with that in the apparatus 101, only the manner of detecting a detection object in the reaction chamber 110 is different while the operation and effect obtained in the apparatus 102 are fundamentally equal to the operation and effect exerted in the apparatus 101. Therefore, an operation of detecting the detection object will be primarily described below, with the rest being omitted from the description or roughly described.

In the case where the substrate 109 is formed of the glass cloth epoxy resin material, an argon gas is supplied by 50SCCM into the reaction chamber 110 from the reaction gas introduction port 111 while the air in the reaction chamber 110 is discharged by the vacuum pump 133. In a state with the reaction chamber maintained at 30 Pa of the degree of vacuum, 200 W RF is applied to the electrode 121 thereby generating plasma. Similar to the case of the substrate surface treatment apparatus 101, argon ions in the plasma are irradiated to the surface of the substrate 109, and nickel hydroxide or the like deposited on the surface of the gold electrode 10 is removed by sputtering. On the other hand, a plurality of kinds of gases present in the reaction chamber 110 are monitored by the mass analyzer 142 at all times after the reaction chamber 110 reaches a specified degree of vacuum or when the plasma is generated. The mass analyzer 142 sends a signal to the controller 150 when the element Br, separated from the substrate 109 formed of the glass cloth epoxy resin material and emitted to the reaction chamber 110, is observed. Based on the supply of the signal, the controller 150 controls the power supply unit 123 and the valve switch 132 to prevent the Br from being sputtered. Accordingly, only the nickel hydroxide deposited on the gold electrode 10 of the substrate 109 can be removed by the irradiation of argon ions without scattering the Br as a constituent of the substrate 109. Corrosion of the electrode 10 caused by the Br can be thus prevented.

The controller 150 controls both of the power supply unit 123 and the valve switch 132 when the mass analyzer 142 detects the Br. However, the above-described effect can be obtained by controlling at least one of the power supply unit 123 and the valve switch 132.

If the substrate 109 is formed of a polyimide film, in order to eliminate residual chlorine ions, the oxygen gas is supplied by 50SCCM into the reaction chamber 110 while the air in the reaction chamber 110 is discharged by the vacuum pump 133 so that the reaction chamber 110 is maintained at the degree of vacuum of 30 Pa. In this state, 200 W RF is applied to the electrode 121, thereby generating plasma. Oxygen ions present in the plasma are irradiated onto the surface of the substrate 109 exposed in the plasma. Residual chlorine ions on the surface of the substrate 109 are hence removed.

The mass analyzer 142 always monitors gases present in the reaction chamber 110. When impurities are completely removed, that is, when the chlorine is not detected in the embodiment or when a concentration of the chlorine decreases to a level where no trouble is brought about, the mass analyzer 142 sends a signal to the controller 150. In response to the signal, the controller 150 controls the power supply unit 123, the valve switch 132 and the reaction gas supply unit 161 to stop the plasma treatment.

As above, since it is enabled to remove the chlorine ions remaining at the substrate 109 formed of the polyimide film, this can prevent corrosion by residual ions, electrical failures such as ion migration or the like which are to be caused if the IC is connected with the use of ACF in a state with the chlorine ions remaining. Moreover, since the plasma treatment of the substrate 109 is stopped when the removal of the chlorine is completed as described hereinabove, it is possible to remove the chlorine ions remaining at the substrate 109 while the effect of oxygen ions on the substrate 109 is limited to a minimum. At the same time, since the substrate 109 is formed of polyimide, as discussed in the "BACKGROUND OF THE INVENTION", the organic contaminant on the polyimide surface can also be removed by the oxygen radicals and the oxygen ions, and functional groups such as C=O, COOH and the like are formed on the surface, whereby the bonding strength between the substrate and the ACF is improved.

The element within the substrate 109 that is controlled to emit from the substrate 109 is Br in the foregoing embodiments. However, the substrate surface treatment apparatuses 101 and 102 in the embodiments can be applied to the other corrosive elements. Similarly, although the element adhering to the substrate 109 is chlorine in the foregoing embodiments, the apparatuses 101 and 102 of the embodiments are applicable to the other elements as well.

In each of the above embodiments, suppressing the emission of the element Br in the substrate 109, and removing the chlorine adhering to the substrate 109 are described separately from each other. Needless to say, however, suppressing the emission of substrate constituents and removing impurities of the substrate may be carried out simultaneously by detecting a plurality of elements by the detecting device 140 such as the above emission spectroscopic analysis device 141, the mass analyzer 142, etc.

Although the reaction gas injected into the reaction chamber 110 is argon and oxygen respectively in the embodiments described above, the present invention is not restricted to the specific kind of gas, and for instance, a mixed gas of argon and oxygen, hydrogen or nitrogen gas can be utilized. It is to be noted, however, that the reaction gas should be selected in some cases from a view point of a relationship with the substance to be processed by the surface treatment, because it is necessary to generate ions or the like effective for the substance to be processed by the surface treatment.

In each embodiment, the grounded opposed electrode 122 is arranged in the reaction chamber 110. The grounded reaction chamber 110 may be adapted to function by itself as an opposed electrode, and the opposed electrode 122 can be eliminated depending on the circumstances.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A substrate surface treatment method for removing deposits from an electrode, wherein the electrode is disposed on a circuit board arranged in a reaction chamber, and wherein the deposits on the electrode are removed by ions in plasma generated in the reaction chamber, such that the electrode and the circuit board are simultaneously exposed to the same plasma the method comprising:

detecting, during the removing of the deposits from the electrode, if a corrosive element as a component of the circuit board is separated from the circuit board by the plasma; and decreasing electric power supplied to the reaction chamber to suppress separation of the corrosive element when the separation of the corrosive element from the circuit board is detected in said detecting, or/and increasing a pressure in the reaction chamber to suppress separation of the corrosive element when the separation of the corrosive element from the circuit board is detected in said detecting,
wherein the removing of the deposits from the electrode is continually performed until removal of the deposits from the electrode is complete.

2. The substrate surface treatment method according to claim 1, wherein said detecting if the corrosive element is separated from the circuit board is observed by an emission spectroscopic analysis.

3. The substrate surface treatment method according to claim 1, wherein the corrosive element is bromine.

4. The substrate surface treatment method according to claim 1, wherein the circuit board is formed of glass cloth epoxy resin.

5. The substrate surface treatment method according to claim 1, wherein the substrate surface treatment method is performed before a wire bonding process.

6. The substrate surface treatment method according to claim 1, wherein when the separation of the corrosive element from the circuit board is detected in said detecting, the electric power supplied to the reaction chamber is decreased and the pressure in the reaction chamber is increased to suppress separation of the corrosive element.

7. A substrate surface treatment method for removing deposits from an electrode, wherein the electrode is disposed on a circuit board formed of glass cloth epoxy resin and arranged in a reaction chamber, and wherein the deposits on the electrode are removed by ions in plasma generated in the reaction chamber, such that the electrode and the circuit board are simultaneously exposed to the same plasma, the method comprising:
detecting, during the removing of the deposits from the electrode, if a component of the circuit board is separated from the circuit board by plasma; and
decreasing electric power supplied to the reaction chamber to suppress separation of the component when the separation of the component from the circuit board is detected in said detecting, or/and increasing a pressure in the reaction chamber to suppress separation of the component when the separation of the component from the circuit board is detected in said detecting,
wherein the removing of the deposits from the electrode is continually performed until removal of the deposits from the electrode is complete.

8. The substrate surface treatment method according to claim 7, wherein the component of the circuit board is a corrosive element.

9. The substrate surface treatment method according to claim 8, wherein the corrosive element is bromine.

10. The substrate surface treatment method according to claim 7, wherein when the separation of the component from the circuit board is detected in said detecting, the electric power supplied to the reaction chamber is decreased and the pressure in the reaction chamber is increased to suppress separation of the component.

* * * * *